United States Patent
Asahi et al.

(10) Patent No.: US 11,524,897 B2
(45) Date of Patent: Dec. 13, 2022

(54) DIELECTRIC COMPOSITION, DIELECTRIC THIN FILM, DIELECTRIC ELEMENT, AND ELECTRONIC CIRCUIT BOARD

(71) Applicant: TDK CORPORATION, Tokyo (JP)

(72) Inventors: Toshio Asahi, Tokyo (JP); Masamitsu Haemori, Tokyo (JP); Masahito Furukawa, Tokyo (JP); Hitoshi Saita, Toyko (JP)

(73) Assignee: TDK CORPORATION, Tokyo (JP)

( * ) Notice: Subject to any disclaimer, the term of this patent is extended or adjusted under 35 U.S.C. 154(b) by 142 days.

(21) Appl. No.: 17/190,045

(22) Filed: Mar. 2, 2021

(65) Prior Publication Data

US 2021/0276868 A1 Sep. 9, 2021

(30) Foreign Application Priority Data

Mar. 9, 2020 (JP) .............................. JP2020-039725

(51) Int. Cl.
*H05K 1/03* (2006.01)
*C01B 21/082* (2006.01)
*H01G 4/005* (2006.01)

(52) U.S. Cl.
CPC ....... *C01B 21/0821* (2013.01); *H05K 1/0353* (2013.01); *C01P 2002/52* (2013.01); *C01P 2006/40* (2013.01); *H01G 4/005* (2013.01)

(58) Field of Classification Search
CPC ............. C01B 21/0821; H05K 1/0353; C01P 2002/52; C01P 2006/40; H01G 4/005
USPC .......................................................... 428/209
See application file for complete search history.

(56) References Cited

U.S. PATENT DOCUMENTS

| | | | | |
|---|---|---|---|---|
| 2002/0010072 A1* | 1/2002 | Fukui | ................... | C01G 23/006 252/500 |
| 2009/0137381 A1* | 5/2009 | Takaishi | ............... | H01G 4/1245 501/135 |
| 2016/0027587 A1* | 1/2016 | Furukawa | ........... | C23C 18/1225 428/697 |
| 2016/0217931 A1* | 7/2016 | Saita | ........................ | H01G 4/33 |
| 2019/0066920 A1* | 2/2019 | Kim | ...................... | H01G 4/1227 |
| 2021/0276868 A1* | 9/2021 | Asahi | ..................... | H05K 1/162 |

FOREIGN PATENT DOCUMENTS

JP 2001-135143 A 5/2001

* cited by examiner

*Primary Examiner* — Betelhem Shewareged
(74) *Attorney, Agent, or Firm* — Oliff PLC

(57) ABSTRACT

To provide a dielectric composition having excellent reliability. The dielectric composition contains a main component represented by a composition formula $(Sr_{1-x}Ca_x)_m(Ti_{1-y}Hf_y)O_{3-\delta}N_\delta$, in which $0.15 < x \leq 0.90$, $0 < y \leq 0.15$, $0.90 \leq m \leq 1.15$, $0 < \delta \leq 0.05$ are satisfied.

6 Claims, 3 Drawing Sheets

DIELECTRIC COMPOSITION, DIELECTRIC THIN FILM, DIELECTRIC ELEMENT, AND ELECTRONIC CIRCUIT BOARD

BACKGROUND OF THE INVENTION

Field of the Invention

The present invention relates to a dielectric composition, a dielectric thin film, a dielectric element, and an electronic circuit board.

Description of the Related Art

JP-A-2001-135143 discloses an invention relating to a dielectric thin film, and discloses that the dielectric thin film has a perovskite structure and contains nitrogen in the perovskite structure. JP-A-2001-135143 discloses that it is possible to provide a dielectric thin film that can be manufactured at low cost even on a substrate having low heat resistance while maintaining a good dielectric property due to the presence of nitrogen.

At present, regarding the dielectric thin film, there is a problem of deterioration in reliability due to deterioration in insulativity under a hydrogen atmosphere.

SUMMARY OF THE INVENTION

An object of the present invention is to provide a dielectric composition having excellent reliability.

A dielectric composition according to the present invention is a dielectric composition containing a main component represented by a composition formula $(Sr_{1-x}Ca_x)_m(Ti_{1-y}Hf_y)O_{3-\delta}N_\delta$, in which
 $0.15 < x \leq 0.90$,
 $0 < y \leq 0.15$,
 $0.90 \leq m \leq 1.15$, and
 $0 < \delta \leq 0.05$ may be satisfied.

The dielectric composition containing the above main components is a highly reliable dielectric composition. In the present invention, reliability is indicated by a degree of deterioration in insulation resistance under a hydrogen atmosphere.

A dielectric thin film according to the present invention contains the above dielectric composition.

A dielectric element according to the present invention includes the above dielectric thin film and an electrode.

The electrode may comprise a Ni foil, and the dielectric thin film may be formed on the Ni foil.

An electronic circuit board according to the present invention includes the above dielectric element.

DETAILED DESCRIPTION OF THE PREFERRED EMBODIMENTS

Figure 1:
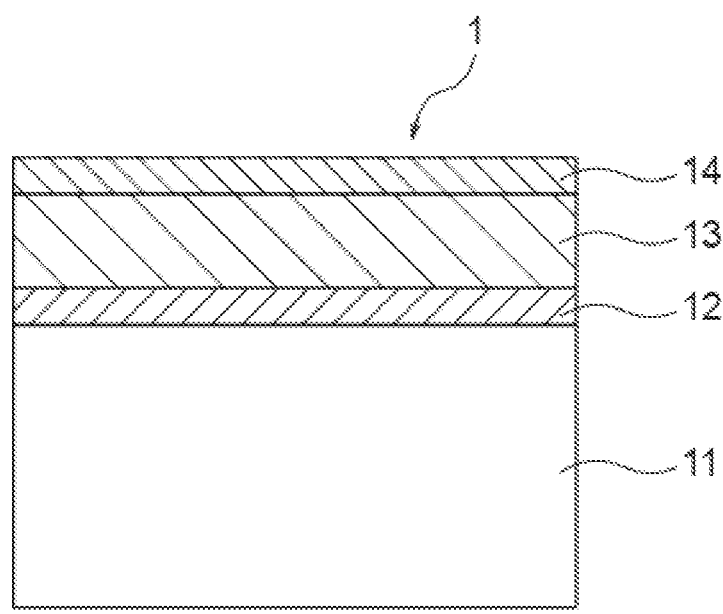
FIG. 1 is a schematic view of a thin film capacitor according to an embodiment of the present invention.

Hereinafter, the present invention will be described based on embodiments shown in the drawings.

(Film Capacitor 1)

FIG. 1 shows a schematic view of a thin film capacitor according to the present embodiment. The thin film capacitor is a kind of a dielectric element. A thin film capacitor 1 shown in FIG. 1 includes a first electrode 12 formed on a substrate 11, a dielectric thin film 13 formed on the first electrode 12, and a second electrode 14 formed on a surface of the dielectric thin film 13. The thin film capacitor 1 does not have to include the substrate 11. For example, a metal foil such as a Ni foil may be used as the first electrode 12, and the dielectric thin film 13 may be formed on the metal foil.

A material of the substrate 11 is not particularly limited, and a Si single crystal substrate may be used as the substrate 11, and in this case, availability and cost are excellent.

Materials of the first electrode 12 and the second electrode 14 are not particularly limited as long as the first electrode 12 and the second electrode 14 function as electrodes. Examples include Pt, Ag, Ni, and Cu. When the first electrode 12 is formed on the substrate 11, a thickness of the first electrode 12 is not particularly limited as long as the first electrode 12 functions as an electrode, and the thickness is preferably 0.1 μm or more and 1.0 μm or less. When the substrate 11 is not provided and the metal foil such as Ni is used for the first electrode 12, the thickness is not particularly limited as long as the first electrode 12 functions as the electrode, and is preferably 1 μm to 100 μm.

The dielectric thin film 13 is a dielectric composition containing a main component represented by a composition formula $(Sr_{1-x}Ca_x)_m(Ti_{1-y}Hf_y)O_{3-\delta}N_\delta$, in which
 $0.15 < x \leq 0.90$,
 $0 < y \leq 0.15$,
 $0.90 \leq m \leq 1.15$, and
 $0 < \delta \leq 0.05$
may be satisfied. The composition formula represents an atomic number ratio of respective elements. Further, it is preferable that the above main component has a perovskite structure in which an A-site element is Sr and Ca and a B-site element is Ti and Hf.

In addition, $0.40 \leq x \leq 0.90$ or $0.01 \leq y \leq 0.15$ may be satisfied. Further, δ may be 0.01 or more. Further, δ is preferably 0.03 or less.

Elements other than the above elements described in the above composition formula may be contained as an impurity, or may be contained within a range that does not significantly impair the reliability. Specifically, the other elements may be contained in an amount of 5% by mass or less, assuming that the entire dielectric composition is 100% by mass.

A method for analyzing the composition of the dielectric thin film 13 is not particularly limited. For example, electron Spectroscopy for Chemical Analysis (ESCA) can be used to analyze the composition of a portion several nm deep from the surface. In the dielectric thin film 13 of the present embodiment, the composition can be analyzed by waveform-separating a narrow scan spectrum of Nis in particular. ESCA is sometimes called X-ray Photoelectron Spectroscopy (XPS).

The inventors have found that when x, y, m and S are set to be within a predetermined range in the dielectric composition containing the main component represented by the composition formula $(Sr_{1-x}Ca_x)_m(Ti_{1-y}Hf_y)O_{3-\delta}N_\delta$, the dielectric thin film 13 containing the dielectric composition is excellent in reliability.

In the present invention, the reliability is indicated by a degree of deterioration in insulation resistance under a hydrogen atmosphere. In addition, it can be said that the smaller the degree of deterioration in insulation resistance, the better the hydrogen resistance and the higher the reliability. The degree of deterioration in insulation resistance is expressed by an absolute value of a common logarithm $\{|\log_{10}$ (IR after hydrogen treatment/initial IR)$|\}$ with a base of 10 regarding a ratio of insulation resistance after hydrogen treatment (IR after hydrogen treatment) to initial insulation resistance (initial IR).

A manufacturing process of an electronic circuit board includes many treatments in an atmosphere containing hydrogen or wet processes. However, the dielectric composition constituting the dielectric thin film 13 tends to have deteriorated insulation resistance when exposed to a reducing atmosphere, particularly a hydrogen atmosphere.

In contrast, the dielectric thin film 13 containing the dielectric composition of the present embodiment has excellent hydrogen resistance. Therefore, it is possible to prevent the deterioration in insulation resistance even when the wet processes or hydrogen atmosphere processes are included in the manufacturing process or use of the electronic circuit board provided with the dielectric thin film 13. In this way, the dielectric thin film 13 of the present embodiment is excellent in reliability at the time of mounting.

The dielectric thin film 13 may be a polycrystalline film or a single crystal film. A thickness of the dielectric thin film 13 is not particularly limited. The thickness may be 30 nm to 1000 nm or 30 nm to 600 nm.

(Electronic Circuit Board 90)

An electronic circuit board according to the present embodiment includes the above dielectric thin film. The electronic circuit board may include an electronic component such as the thin film capacitor containing the above dielectric thin film. The electronic component such as the thin film capacitor may be installed on a surface of the electronic circuit board. The electronic component such as the thin film capacitor may be embedded in the electronic circuit board.

Figure 2A:
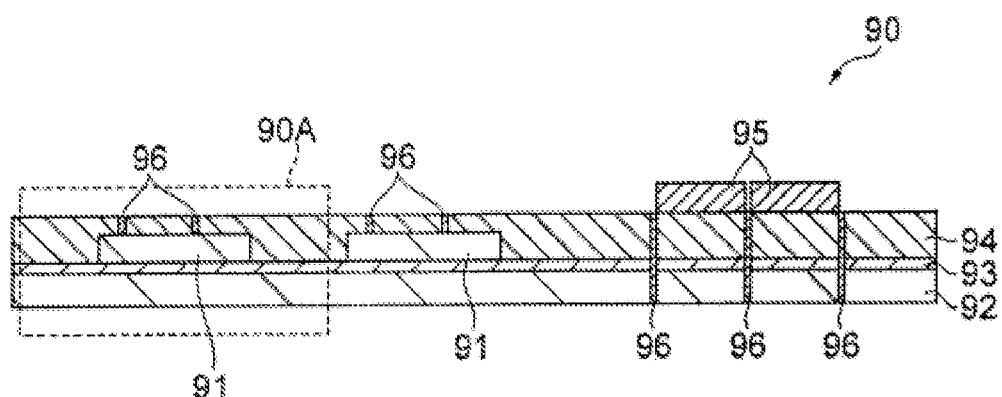
FIG. 2A is a schematic cross-sectional view of an electronic circuit board according to an embodiment of the present invention.
Figure 2B:
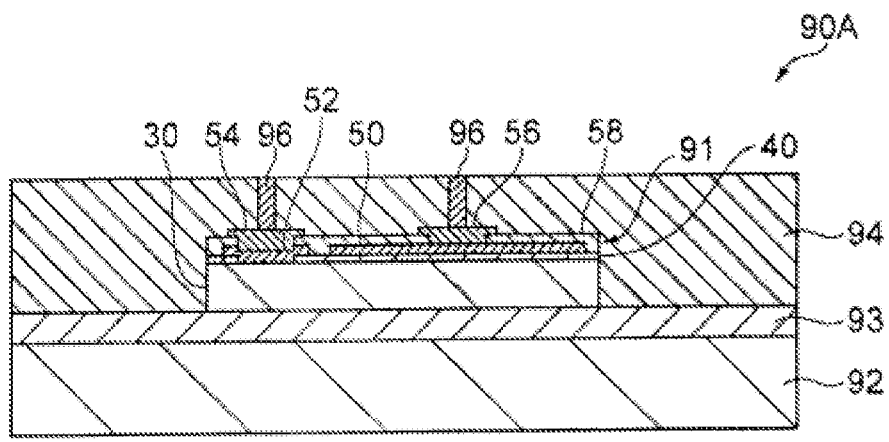
FIG. 2B is a partially enlarged view of the electronic circuit board shown in FIG. 2A.

An example of the electronic circuit board according to the present embodiment is shown in FIGS. 2A and 2B. As shown in FIG. 2A, an electronic circuit board 90 includes a resin substrate 92, a resin layer 93 covering the resin substrate 92, and thin film capacitors 91 installed on a surface of the resin layer 93 opposite to the resin substrate 92.

The electronic circuit board 90 may further include an insulating coating layer 94 covering the resin layer 93 and the thin film capacitor 91, and an electronic component 95 installed on the insulating coating layer 94, and a plurality of metal wires 96.

At least a part of the metal wires 96 may be drawn out to a surface of the resin substrate 92 or the insulating coating layer 94. At least a part of the metal wires 96 may be connected to extraction electrodes 54, 56 of the thin film capacitor 91, or to an electronic component 95. At least a part of the metal wires 96 may penetrate the electronic circuit board 90 in a direction from a front surface to a back surface of the electronic circuit board 90. A material of the resin substrate 92 is not particularly limited. For example, the resin substrate 92 may be an epoxy resin substrate made of an epoxy resin.

FIG. 2B is an enlarged schematic view of a portion denoted by 90A in FIG. 2A. As shown in FIG. 2B, the thin film capacitor 91 included in the electronic circuit board according to the present embodiment includes a first electrode 30, a dielectric thin film 40 provided on a surface of the first electrode 30, and a second electrode 50 provided on a part of a surface of the dielectric thin film 40 opposite to the first electrode 30. The thin film capacitor 91 may further include a through-hole electrode 52 provided on the surface of the first electrode 30 through a portion of the dielectric thin film 40 where the second electrode 50 is not provided, an insulating resin layer 58, the extraction electrode 54, and the extraction electrode 56.

The second electrode 50, the dielectric thin film 40, and the through-hole electrode 52 may be covered with the insulating resin layer 58. The extraction electrode 54 may be provided directly on a surface of the through-hole electrode 52 through the insulating resin layer 58. The extraction electrode 56 may be provided directly on the surface of the second electrode 50 through the insulating resin layer 58.

Method for Manufacturing Thin Film Capacitor 1

Next, a method for manufacturing the thin film capacitor 1 will be described.

A method of forming a thin film that finally functions as the dielectric thin film 13 is not particularly limited. Examples thereof include a vacuum deposition method, a sputtering method, a pulse laser deposition method (PLD method), an organic metal chemical vapor deposition method (MO-CVD), an organic metal decomposition method (MOD), a sol-gel method, and a chemical solution deposition method (CSD). Further, raw materials used for film formation may contain minute impurities and auxiliary components, but there is no particular problem as long as the amount does not significantly impair a performance of the thin film.

When a film is formed by a method such as the PLD method, the sputtering method, or the CSD method among the above film forming methods, a finally obtained thin film tends to be a polycrystalline film. Although synthesis is possible by the CVD method, the PLD method and the sputtering method have higher composition controllability. In the present embodiment, a film forming method by using PLD method will be described.

First, a Si single crystal substrate is prepared as the substrate 11. Next, the first electrode 12 is formed on the Si single crystal substrate. A method of forming the first electrode 12 is not particularly limited. For example, a sputtering method or a CVD can be mentioned. A metal foil such as a Ni foil may be used as the first electrode 12 without preparing the substrate 11. When the Ni foil is used as the first electrode 12, there is an advantage that the first electrode 12 can be easily mounted on an electronic circuit.

Next, a metal oxide thin film is formed on the first electrode 12 by the PLD method. If necessary, a metal mask may be used to form a region where a part of the thin film is not formed to expose a part of the first electrode 12.

In the PLD method, first, a target containing constituent elements of a target dielectric thin film, that is, Sr, Ti, Ca, and Hf, is installed in a film forming chamber. Next, a surface of the target is irradiated with a pulsed laser. A strong energy of the pulsed laser instantly evaporates the surface of the target. Then, evaporates are deposited on the substrate 11 or the first electrode 12 arranged so as to face the target, a the dielectric thin film (a metal oxide thin film) containing the main component represented by the composition formula $(Sr_{1-x}Ca_x)_m(Ti_{1-y}Hf_y)O_3$ is formed.

The type of the target is not particularly limited, and a metal oxide sintered body containing the constituent elements of the metal oxide thin film to be produced can be used. In the present embodiment, examples include oxides of Sr, Ti, Ca, and Hf, composite oxides such as $SrTiO_3$ and $CaHfO_3$, and metal compounds that form oxides of each metal element by sintering. In addition, it is preferable that each element is evenly distributed in the target, but a distribution may vary within a range that does not influence a quality of a finally obtained dielectric thin film. Further, the number of the target does not necessarily to be one, and a plurality of targets containing a part of the constituent elements of the metal oxide thin film can be prepared and used for film formation.

A shape of the target is not limited, and may be suitable for a film forming apparatus to be used. Further, m of the metal oxide thin film can be controlled by adjusting film forming conditions (oxygen gas pressure, nitrogen gas pressure, a size of the film forming chamber, a position of gas introduction tube, etc.). For example, m in a formed film can be changed by changing m of the target. Not only m of the target but also the film forming conditions are important. This is because the metal element evaporated from the target by the pulse laser is influenced by elements constituting an atmosphere in the film forming chamber and reaches a film forming surface of the substrate 11 or the first electrode 12.

Further, in the PLD method, the substrate 11 and/or the first electrode 12 may be heated by an infrared laser at the time of film formation in order to crystallize the formed metal oxide thin film. A heating temperature for the substrate 11 and/or the first electrode 12 varies depending on the constituent elements and compositions of the metal oxide thin film and the substrate 11, and is preferably 300° C. to 800° C., for example. By setting a temperature of the substrate 11 to an appropriate temperature, the metal oxide thin film can be easily crystallized and cracks that occur during cooling can be prevented.

Next, the metal oxide thin film can be nitrided by reduction firing, and the dielectric thin film containing the dielectric composition containing the main component represented by the composition formula $(Sr_{1-x}Ca_x)_m(Ti_{1-y}Hf_y)O_{3-\delta}N_\delta$ can be obtained.

A method of the reduction firing is not particularly limited. For example, the metal oxide thin film can be nitrided by reduction-firing the metal oxide thin film in a nitrogen gas-containing atmosphere or an ammonia gas-containing atmosphere in a state where the metal oxide thin film and carbon are arranged close to each other. Since the metal oxide thin film can be more nitrided by setting the ammonia gas-containing atmosphere, it is preferable to set the ammonia gas-containing atmosphere in the present embodiment. In the present embodiment, it is more preferable that the atmospheric gas contains 1.0 vol % to 10.0 vol % of ammonia gas.

A method of arranging the metal oxide thin film and carbon close to each other is not particularly limited. Examples thereof include a method using a firing furnace in which at least a part is made of carbon, a method of charging carbon (a shape is not particularly limited) into the firing furnace, a method of charging the metal oxide thin film to a container in which at least a part is made of carbon and performing firing. Further, two or more of the above methods may be used in combination. In addition, the above carbon is not limited to a carbon simple substance, and may be a carbon compound.

A lower limit of a firing temperature during the reduction firing is not particularly limited as long as the temperature is sufficient for the reduction firing. An upper limit of the firing temperature during the reduction firing is not particularly limited as long as the first electrode and the dielectric thin film do not melt. The firing temperature during the reduction firing may be, for example, 400° C. or higher and 1000° C. or lower, and preferably 600° C. or higher and 900° C. or lower. A firing time during the reduction firing is not particularly limited. For example, the firing time may be 30 minutes or longer and 300 minutes or shorter. An oxygen partial pressure in the nitrogen gas-containing atmosphere during the reduction firing is not particularly limited. For example, the oxygen partial pressure may be $1\times10^3$ Pa or less.

Finally, the second electrode 14 is formed on the dielectric thin film 13 to manufacture the thin film capacitor 1. The material of the second electrode 14 is not particularly limited, and Ag, Au, Cu, Ni and the like can be used. Further, a method of forming the second electrode 14 is not particularly limited, and the second electrode 14 can be formed by, for example, a sputtering method.

Method for Manufacturing Electronic Circuit Board 90

Next, a method for manufacturing the electronic circuit board 90 will be described with reference to FIGS. 2A and 2B.

The method for manufacturing the electronic circuit board 90 is not particularly limited. For example, the electronic circuit board 90 may be manufactured by the following method. First, a surface of the resin substrate 92 is covered with an uncured resin layer. The uncured resin layer is a precursor of the resin layer 93. The thin film capacitor 91 is installed on a surface of the uncured resin layer. At this time, the first electrode 30 of the thin film capacitor 91 is made to face the uncured resin layer.

Next, the thin film capacitor 91 is sandwiched between the resin substrate 92 and the insulating coating layer 94 by covering the uncured resin layer and the thin film capacitor 91 with the insulating coating layer 94. Next, the resin layer 93 is formed by thermosetting the uncured resin layer.

Next, the insulating coating layer 94 is pressure-bonded to the resin substrate 92, the thin film capacitor 91, and the resin layer 93 by hot pressing to form a laminated substrate. Next, a plurality of through holes penetrating the laminated substrate are formed. Then, the metal wires 96 are formed in respective through holes. After forming the metal wires 96, the electronic component 95 is installed on the surface of the insulating coating layer 94. By the above method, the electronic circuit board 90 in which the thin film capacitor 91 is embedded can be obtained.

A material of each metal wire 96 is not particularly limited. For example, the metal wire 96 may be made of a conductor such as Cu. A material of the uncured resin layer is not particularly limited. For example, the uncured resin layer may be a B-stage thermosetting resin. The type of the thermosetting resin is not particularly limited. For example, the uncured resin layer may be an epoxy resin or the like. The B-stage thermosetting resin is not completely cured at room temperature, and is completely cured by heating. A material of the insulating coating layer 94 is not particularly limited. For example, the insulating coating layer 94 may be an epoxy resin, a polytetrafluoroethylene resin, or a polyimide resin.

The electronic component 95 is not particularly limited, and for example, an IC chip can be used.

Although the embodiments of the present invention have been described above, the present invention is not limited to such embodiments, and it goes without saying that the present invention can be implemented in various different modes without departing from the gist of the present invention.

Figure 3:
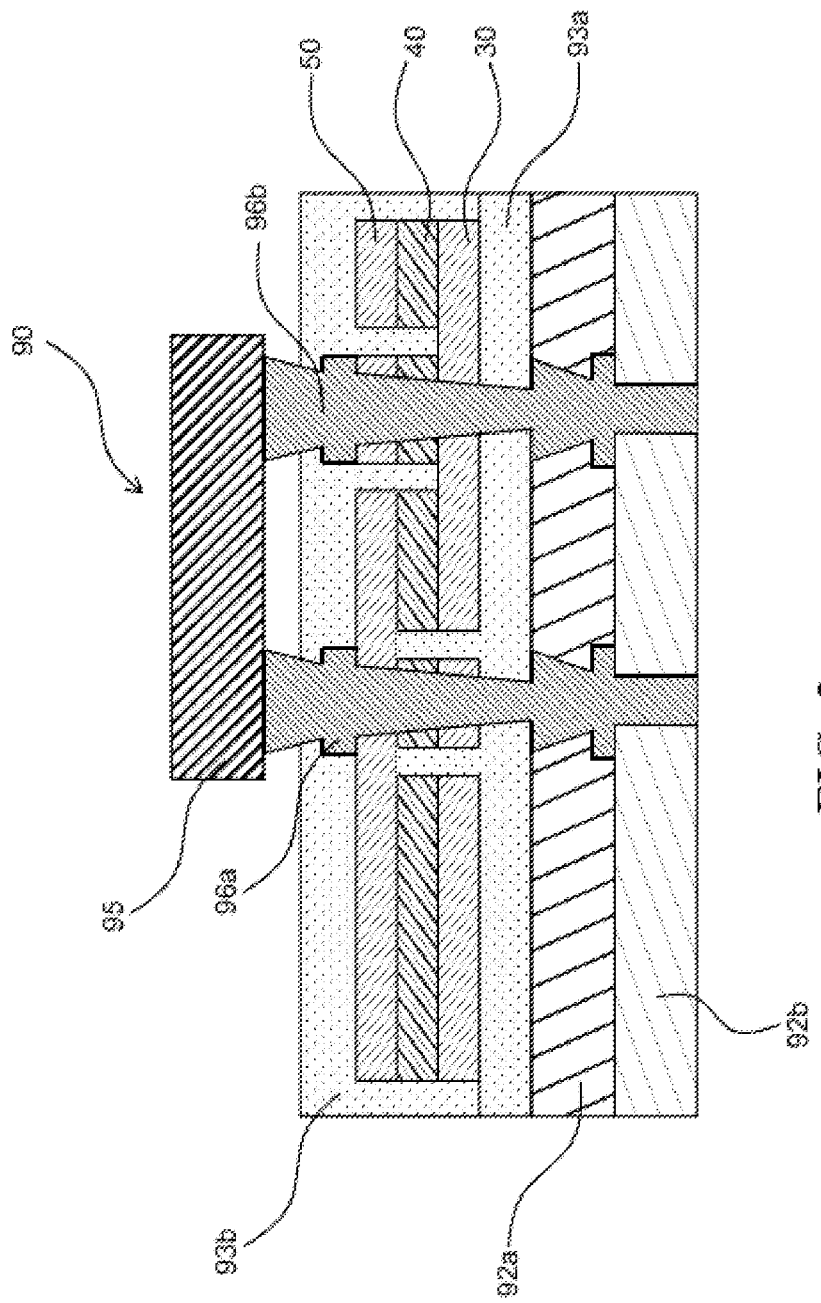
FIG. 3 is a schematic cross-sectional view of an electronic circuit board according to another embodiment of the present invention.

For example, the above-mentioned dielectric composition can be used for the dielectric thin film 40 of an electronic circuit board 90a shown in FIG. 3. In FIG. 3, the dielectric thin film 40 is sandwiched between the first electrode 30 and the second electrode 50. A through-hole type extraction electrode 96a and the second electrode 50 are electrically connected to each other, and a through-hole type extraction electrode 96b and the first electrode 30 are electrically connected to each other.

In addition, the through-hole type extraction electrode 96a and the first electrode 30 are insulated to each other by an insulating resin layer 93a. Similarly, the through-hole type extraction electrode 96b and the second electrode 50 are insulated to each other by an insulating resin layer 93b.

The dielectric element according to the present invention is an element utilizing a dielectric property, and includes a capacitor, a thermistor, a filter, a diplexer, a resonator, a transmitter, an antenna, a piezoelectric element, a transistor, a ferroelectric memory, and the like. The dielectric thin film according to the present embodiment is particularly preferably used for a power supply decoupling capacitor.

The electronic circuit board according to the present invention includes the above-mentioned dielectric element. The electronic circuit board according to the present invention is particularly preferably used for an IC package and an electronic substrate module.

EXAMPLES

Hereinafter, the present invention will be described based on more detailed Examples, but the present invention is not limited to these Examples.

Experimental Example 1

First, a $SrCO_3$ powder, a $CaCO_3$ powder, a $TiO_2$ powder, and an $HfO_2$ powder were prepared as raw materials for a sintered body used as a film forming target. Each powder was weighed such that x, y and m were values shown in Table 1 in the finally obtained dielectric thin film.

Next, powders were mixed for 16 hours in a wet ball mill using water or ethanol as a solvent to obtain a mixed slurry.

Next, the mixed slurry was dried at 80° C. for 12 hours in a constant temperature dryer to obtain a mixture.

Next, the mixture was lightly crushed in a mortar and charged into a ceramic crucible. Then, the crushed mixture was heat-treated at 700° C. to 1000° C. for 2 hours to 5 hours in an air atmosphere using an electric furnace to obtain a calcined product.

Next, the calcined product was crushed in the mortar and then finely pulverized in the wet ball mill using water or ethanol as a solvent for 16 hours to obtain a calcined slurry.

The obtained calcined slurry was dried at 80° C. for 12 hours in a constant temperature dryer to obtain a finely pulverized powder.

A polyvinyl alcohol solution was added as a binder to the finely pulverized powder and mixed to obtain a granulated powder. An addition amount of the polyvinyl alcohol solution was 0.6% by mass with respect to 100% by mass of the finely pulverized product.

The granulated product was molded into a disc shape having a diameter of about 23 mm and a thickness of about 9 mm to obtain a molded product. The molded product was uniaxial press molded, and then CIP molded.

The molded product was debindered at 400° C. to 600° C. in the air atmosphere using the electric furnace, and then fired at 1200° C. to 1400° C. for 4 hours to 10 hours to obtain a sintered product. Further, an upper surface and a lower surface of the sintered product were mirror-polished to obtain a film forming target having a height of 5 mm. It was confirmed that a relative density of the obtained film forming target was 96% to 98%.

The film forming target obtained as described above was installed in a film forming apparatus, and finally the Ni foil functioning as the first electrode was installed so as to face the film forming target. The thickness of the Ni foil was 30 m.

Next, the dielectric thin film (the metal oxide thin film) was formed on the first electrode by the PLD method so as to have a thickness of 200 nm. At this time, by adjusting the film forming conditions, m of the obtained metal oxide thin film was controlled. A time required for film formation was 0.5 hours to 2 hours.

Next, in experimental examples other than Comparative Example 2, the metal oxide thin film was nitrided by reduction firing to obtain a dielectric thin film containing the dielectric composition containing the main component represented by the composition formula $(Sr_{1-x}Ca_x)_m(Ti_{1-y}Hf_y)O_{3-\delta}N_\delta$.

The metal oxide thin film was nitrided by reduction-firing the metal oxide thin film in the ammonia gas-containing atmosphere in the state where the metal oxide thin film and carbon were arranged close to each other. By using a graphite sheet, the metal oxide thin film and carbon were arranged close to each other.

δ was controlled to values shown in the following table by controlling conditions of the reduction firing. The firing temperature during the reduction firing was 700° C. or higher and 900° C. or lower. The firing time during the reduction firing was 30 minutes or longer and 300 minutes or shorter. The oxygen partial pressure during the reduction firing was $1\times10^3$ Pa or less.

Subsequently, a second electrode was formed on the obtained dielectric thin film by sputtering using Ni.

A thickness of the obtained dielectric thin film was 200 nm. The insulation resistance (initial IR) and the insulation resistance after hydrogen treatment (IR after hydrogen treatment) at room temperature (25° C.) were measured for the obtained dielectric thin film.

A hydrogen treatment of the dielectric thin film was carried out by placing the obtained dielectric thin film in a nitrogen gas-containing atmosphere containing 0.1 Vol % to 0.3 Vol % of hydrogen heated to 240° C. for 2 hours. The insulation resistance (IR) was measured by applying a DC voltage of 20 V to the dielectric thin film using a digital ultra-high resistance meter (R8340A manufactured by ADVANTEST).

Based on the obtained initial IR and IR after hydrogen treatment, the degree of deterioration in insulation resistance, that is, the absolute value of $\{\log_{10}$ (IR after hydrogen treatment/initial IR)$\}$ was obtained. Results are shown in Table 1. The degree of deterioration in insulation resistance of 3.0 or less was evaluated to be good.

TABLE 1

| Sample number | Sr 1-x | Ca x | Ti 1-y | Hf y | O 3-δ | N δ | (Sr + Ca)/(Ti + Hf) m | Degree of deterioration in insulation resistance |
|---|---|---|---|---|---|---|---|---|
| Example 1 | 0.84 | 0.16 | 0.95 | 0.05 | 2.97 | 0.03 | 1.00 | 2.5 |
| Example 2 | 0.75 | 0.25 | 0.99 | 0.01 | 2.97 | 0.03 | 1.00 | 2.6 |
| Example 3 | 0.60 | 0.40 | 0.85 | 0.15 | 2.97 | 0.03 | 1.00 | 2.5 |
| Example 4 | 0.50 | 0.50 | 0.90 | 0.10 | 2.97 | 0.03 | 1.00 | 2.2 |
| Example 5 | 0.40 | 0.60 | 0.95 | 0.05 | 2.97 | 0.03 | 1.00 | 2.1 |
| Example 6 | 0.25 | 0.75 | 0.99 | 0.01 | 2.97 | 0.03 | 1.00 | 2.0 |
| Example 7 | 0.17 | 0.83 | 0.85 | 0.15 | 2.97 | 0.03 | 1.00 | 1.8 |
| Example 8 | 0.10 | 0.90 | 0.90 | 0.10 | 2.97 | 0.03 | 1.00 | 1.5 |
| Example 9 | 0.35 | 0.65 | 0.95 | 0.05 | 2.99 | 0.01 | 1.00 | 2.1 |

TABLE 1-continued

| Sample number | Sr 1-x | Ca x | Ti 1-y | Hf y | O 3-$\delta$ | N $\delta$ | (Sr + Ca)/(Ti + Hf) m | Degree of deterioration in insulation resistance |
|---|---|---|---|---|---|---|---|---|
| Example 10 | 0.40 | 0.60 | 0.90 | 0.10 | 2.98 | 0.02 | 1.00 | 2.3 |
| Example 11 | 0.25 | 0.75 | 0.99 | 0.01 | 2.96 | 0.04 | 1.00 | 2.6 |
| Example 12 | 0.60 | 0.40 | 0.95 | 0.05 | 2.95 | 0.05 | 1.00 | 2.8 |
| Example 13 | 0.35 | 0.65 | 0.90 | 0.10 | 2.97 | 0.03 | 0.90 | 2.2 |
| Example 14 | 0.75 | 0.25 | 0.95 | 0.05 | 2.97 | 0.03 | 1.15 | 2.8 |
| Comparative Example 1 | 0.84 | 0.16 | 0.95 | 0.05 | 2.94 | 0.06 | 1.00 | 3.7 |
| Comparative Example 2 | 0.84 | 0.16 | 0.95 | 0.05 | 3.00 | 0.00 | 1.00 | 3.3 |
| Comparative Example 3 | 0.09 | 0.91 | 0.99 | 0.01 | 2.97 | 0.03 | 1.00 | 3.1 |
| Comparative Example 4 | 0.11 | 0.89 | 1.00 | 0.00 | 2.97 | 0.03 | 1.00 | 3.1 |
| Comparative Example 5 | 0.85 | 0.15 | 0.84 | 0.16 | 2.97 | 0.03 | 1.00 | 3.4 |
| Comparative Example 6 | 0.60 | 0.40 | 0.90 | 0.10 | 2.97 | 0.03 | 0.89 | 3.5 |
| Comparative Example 7 | 0.60 | 0.40 | 0.90 | 0.10 | 2.97 | 0.03 | 1.16 | 3.4 |

It is confirmed that when x, y, $\delta$ and m are within the predetermined range (Examples 1 to 14), the degree of deterioration in insulation resistance is smaller, the hydrogen resistance is more excellent, and the reliability is more excellent as compared with the case where any one of x, y, $\delta$ and m is out of the predetermined range (Comparative Examples 1 to 7).

REFERENCE SIGNS LIST

1 thin film capacitor
11 substrate
12 first electrode
13 dielectric thin film
14 second electrode
90, 90a electronic circuit board
91 thin film capacitor
30 first electrode
40 dielectric thin film
50 second electrode
52 through-hole electrode
54, 56 extraction electrode
58 insulating resin layer
92 resin substrate
92a, 92b substrate
93 resin substrate
93a, 93b insulating resin layer
94 insulating coating layer
95 electronic component
96 metal wire

What is claimed is:

1. A dielectric composition comprising:
a main component represented by a composition formula

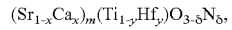

$(Sr_{1-x}Ca_x)_m(Ti_{1-y}Hf_y)O_{3-\delta}N_\delta,$ wherein
$0.15 < x \leq 0.90,$
$0 < y \leq 0.15,$
$0.90 \leq m \leq 1.15,$ and
$0 < \delta \leq 0.05$ are satisfied.

2. A dielectric thin film comprising:
the dielectric composition according to claim 1.

3. A dielectric element comprising:
the dielectric thin film according to claim 2; and
an electrode.

4. The dielectric element according to claim 3, wherein the electrode comprises a Ni foil, and the dielectric thin film is formed on the Ni foil.

5. An electronic circuit board comprising:
the dielectric element according to claim 3.

6. An electronic circuit board comprising:
the dielectric element according to claim 4.

* * * * *